(12) United States Patent
Sawada (10) Patent No.: US 8,790,990 B2
(45) Date of Patent: Jul. 29, 2014

(54) SILICA-BASED FILM FORMING MATERIAL FOR FORMATION OF AIR GAPS, AND METHOD FOR FORMING AIR GAPS

(75) Inventor: Yoshihiro Sawada, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 13/016,637

(22) Filed: Jan. 28, 2011

(65) Prior Publication Data

US 2011/0189833 A1 Aug. 4, 2011

(30) Foreign Application Priority Data

Feb. 4, 2010 (JP) ................................. 2010-023113
Jan. 6, 2011 (JP) ................................. 2011-001510

(51) Int. Cl.
*H01L 21/76* (2006.01)

(52) U.S. Cl.
USPC ...... 438/421; 438/619; 438/623; 257/E21.26; 257/E21.261

(58) Field of Classification Search
USPC .......................... 438/421, 619, 623; 524/588; 257/E21.26, E21.261
See application file for complete search history.

(56) References Cited

U.S. PATENT DOCUMENTS

| | | | |
|---|---|---|---|
| 6,413,647 B1 * | 7/2002 | Hayashi et al. | 428/447 |
| 6,838,355 B1 * | 1/2005 | Stamper et al. | 438/409 |
| 6,905,938 B2 * | 6/2005 | Yang et al. | 438/422 |
| 7,867,890 B2 | 1/2011 | Seto et al. | |
| 8,129,264 B2 * | 3/2012 | Kim et al. | 438/619 |
| 2002/0156180 A1 * | 10/2002 | Yamada et al. | 524/588 |
| 2003/0008989 A1 * | 1/2003 | Gore et al. | 526/227 |
| 2009/0017272 A1 * | 1/2009 | Phillips et al. | 428/195.1 |

FOREIGN PATENT DOCUMENTS

JP 2008-109043 5/2008

OTHER PUBLICATIONS

Brinker, "Hydrolysis and Condensation of Silicates: Effect on Structure," Journal of Non-Crystalline Solids 100 (1988), pp. 31-50.*

* cited by examiner

*Primary Examiner* — Julia Slutsker
(74) *Attorney, Agent, or Firm* — Knobbe Martens Olson & Bear LLP (57) ABSTRACT

Provided is a silica-based film forming material for formation of air gaps, the material being capable of forming air gaps without employing a CVD method. A silica-based film forming material for formation of air gaps including (a) a certain siloxane polymer, (b) an alkanolamine, and (c) an organic solvent is used when a silica-based film is formed with a spin coating method. According to this silica-based film forming material for formation of air gaps, air gaps with a great degree of opening can be formed even when coated with a spin coating method, without filling the recessed parts.

6 Claims, 5 Drawing Sheets

SILICA-BASED FILM FORMING MATERIAL FOR FORMATION OF AIR GAPS, AND METHOD FOR FORMING AIR GAPS

This application is based on and claims the benefit of priority from Japanese Patent Application Nos. 2010-023113 and 2011-001510, respectively filed on 4 Feb. 2010 and 6 Jan. 2011, the contents of which are incorporated herein by reference.

BACKGROUND OF THE INVENTION

1. Field of the Invention

The present invention relates to a silica-based film forming material, which is provided for formation of air gaps that are used as an insulating structure in semiconductor substrates or semiconductor multilayer wiring substrates, and further relates to a method for forming air gaps using such a material.

2. Related Art

In recent years, intervals of wirings that connect elements have been reduced in response to enhanced integration of semiconductor devices and improved performances of large scale integrated (LSI) circuits. It is known that parasitic capacitance is generated as intervals of wirings are thus reduced, whereby decrease in such a parasitic capacitance has been demanded. Generally, SOG (spin-on glass) materials, CVD (chemical vapor deposited) materials and the like have been employed as materials that constitute interlayer insulating films, and low dielectric constant materials such as materials containing silicon and/or carbon, and materials enabling formation of fine pores have been employed for achieving low dielectric constant in these materials. However, when these low dielectric constant materials are used, problems such as reduction in mechanical strength, and lowering of process resistance reportedly occur, and thus development of means capable of decreasing parasitic capacitance without using a low dielectric constant material has been desired.

Known techniques of lowering parasitic capacitance in addition to use of a low dielectric constant material include air gap-forming techniques by which air gaps are intentionally formed among wirings. For example, Patent Document 1 discloses a method for the production of a semiconductor device which includes the steps of: forming a plurality of wirings so as to be adjacent with each other on a first insulating film which had been formed on a semiconductor substrate, and forming a second insulating film on the first insulating film with a plasma CVD method; coating wirings on the second insulating film such that air gaps are formed among adjacent wirings; and the like.

Patent Document 1: Japanese Unexamined Patent Application, Publication No. 2008-109043

SUMMARY OF THE INVENTION

However, when air gaps are formed with a CVD method, deposition of the insulating film occurs also inside the recessed parts; therefore, the air gaps formed by this method are accompanied by a problem of a significant tendency to lower the void ratio. When air gaps having a low void ratio are formed, problems such as failure in decreasing capacity between wirings to a required level may occur.

Therefore, an object of the present invention is to provide a silica-based film forming material for formation of air gaps, the material being capable of forming air gaps with a spin coating method without employing a CVD method, and to provide a method for forming air gaps in which the material is used.

The present inventors have conducted extensive studies in view of the foregoing problems. As a result, the inventors found that the aforementioned problems can be solved by a silica-based film forming material containing a certain siloxane polymer, an alkanolamine and an organic solvent, and have completed the present invention. More specifically, the present invention is configured as described below.

A first aspect of the present invention provides a silica-based film forming material for formation of air gaps, containing (a) a siloxane polymer prepared by subjecting a silane compound represented by the following general formula (a-1) to hydrolytic condensation, (b) an alkanolamine, and (c) an organic solvent:

$$R^1{}_n Si(OR^2)_{4-n} \qquad (a\text{-}1)$$

in the general formula (a-1), $R^1$ represents a hydrogen atom, or an alkyl group or an aryl group having 1 to 20 carbon atoms; $R^2$ represents a monovalent organic group; and n represents an integer of no less than 0 and no greater than 2.

A second aspect of the present invention provides a method for forming air gaps including: coating the silica-based film forming material for formation of air gaps of the present invention on a semiconductor substrate or a semiconductor multilayer wiring substrate having recessed parts with a spin coating method; and baking to form a silica-based film.

The silica-based film forming material for formation of air gaps of the present invention is used when a silica-based film is formed by a spin coating method. In this respect, since the silica-based film forming material for formation of air gaps contains (a) a certain siloxane polymer, (b) an alkanolamine, and (c) an organic solvent, air gaps can be formed even when the material is coated with a spin coating method.

DETAILED DESCRIPTION OF THE INVENTION

Hereinafter, embodiments of the present invention will be explained in detail.

Silica-based Film Forming Material for Formation of Air Gaps

The silica-based film forming material for formation of air gaps of the present invention (hereinafter, merely referred to as "silica-based film forming material") contains (a) a certain siloxane polymer, (b) an alkanolamine, and (c) an organic solvent. In addition, the silica-based film forming material of the present invention optionally contains (d) water and (e) an acid. When a silica-based film is formed using the silica-based film forming material of the present invention with a spin coating method, air gaps can be formed also with a spin coating method since flowability of the silica-based film forming material is reduced thus considerably preventing recessed parts formed on the semiconductor substrate or the semiconductor multilayer wiring substrate from being filled.

(a) Siloxane Polymer

The silica-based film forming material of the present invention contains a siloxane polymer prepared by subjecting a silane compound represented by the following general formula (a-1) (hereinafter, may be merely referred to as "silane compound") to hydrolytic condensation.

$$R^1{}_n Si(OR^2)_{4-n} \qquad (a\text{-}1)$$

In the general formula (a-1), $R^1$ represents a hydrogen atom, or an alkyl group or an aryl group having 1 to 20 carbon atoms; $R^2$ represents a monovalent organic group; and n represents an integer of no less than 0 and no greater than 2.

Herein, the monovalent organic group may include, for example, an alkyl group, an aryl group, an allyl group, a glycidyl group or the like. Among these, preferred are an alkyl group and an aryl group. The alkyl group preferably has 1 to 5 carbon atoms, and specific alkyl groups include a methyl group, an ethyl group, a propyl group, a butyl group, and the like. Also, the alkyl group may be either linear or branched, and a hydrogen atom of the alkyl group may be substituted with a fluorine atom. The aryl group preferably has 6 to 20 carbon atoms, and may include, for example, a phenyl group, a naphthyl group or the like.

Specific examples of the silane compound represented by the above general formula (a-1) include the following compounds.

(a-1-1) Those in which n is 0

When n is 0, the silane compound represented by the above general formula (a-1) may include tetramethoxysilane, tetraethoxysilane, tetrapropoxysilane, tetrabutoxysilane or the like.

(a-1-2) Those in which n is 1

When n is 1, the silane compound represented by the above general formula (a-1) may include monoalkyltrialkoxysilane such as monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane or monopropyltriethoxysilane; or monophenyltrialkoxysilane such as monophenyltrimethoxysilane or monophenyltriethoxysilane.

(a-1-3) Those in which n is 2

When n is 2, the silane compound represented by the above general formula (a-1) may include dialkyldialkoxysilane such as dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane or dipropyldipropoxysilane; or diphenyldialkoxysilane such as diphenyldimethoxysilane or diphenyldiethoxysilane.

Mass Average Molecular Weight of Siloxane Polymer

The siloxane polymer contained in the silica-based film forming material of the present invention preferably has a mass average molecular weight of no less than 3,000 and no greater than 1,000,000 equivalent to polystyrene as determined on gel filtration chromatography. Due to the siloxane polymer having a mass average molecular weight falling within the above range, filling of recessed parts formed on a semiconductor substrate or a semiconductor multilayer wiring substrate with a silica-based film forming material hardly occurs even when a silica-based film is formed with a spin coating method, whereby air gaps with a high void ratio can be formed on the semiconductor substrate or the semiconductor multilayer wiring substrate. The mass average molecular weight is more preferably no less than 5,000 and no greater than 100,000, still more preferably no less than 5,500 and no greater than 50,000, and particularly preferably no less than 6,000 and no greater than 20,000.

Dispersity Index of Siloxane Polymer

The siloxane polymer included in the silica-based film forming material of the present invention preferably has a dispersity index (mass average molecular weight/number average molecular weight) of greater than 1.0 and no greater than 10. Due to the siloxane polymer having a dispersity index falling within the above range, air gaps with a high void ratio can be formed on the semiconductor substrate or the semiconductor multilayer wiring substrate. The dispersity index is more preferably no less than 1.5 and no greater than 8, and still more preferably no less than 2 and no greater than 5.

The siloxane polymer that is a hydrolytic condensate of the silane compound represented by the above general formula (a-1) can be obtained by allowing the aforementioned silane compound that serves as a polymerization monomer to react in an organic solvent in the presence of an acid catalyst or a base catalyst.

It is to be noted that the silane compound which serves as a polymerization monomer may be used either alone, or as a mixture of two or more thereof. The silane compound is preferably used as a mixture of two or more thereof. In this case, it is preferred that such a silane compound represented by the above general formula (a-1) wherein n is 0 be included at a rate of 1 to 50% by mass, and such a silane compound wherein n is 1 or 2 be included at a rate of 99 to 50% by mass. More preferably, such a silane compound wherein n is 0 is included at a rate of 5 to 40% by mass, and such a silane compound wherein n is 1 or 2 is included at a rate of 95 to 60% by mass.

Moreover, trialkylalkoxysilane such as trimethylmethoxysilane, trimethylethoxysilane, trimethylpropoxysilane, triethylmethoxysilane, triethylethoxysilane, triethylpropoxysilane, tripropylmethoxysilane, or tripropylethoxysilane; triphenylalkoxysilane such as triphenylmethoxysilane or triphenylethoxysilane; or the like may be added during hydrolysis.

For permitting condensation of the silane compound, it is necessary to first subject the silane compound to hydrolysis. In general, the quantity of water added is preferably no less than 1.0 time by mole and no greater than 10.0 times by mole, and more preferably no less than 1.5 times by mole and no greater than 8.0 times by mole relative to total number of moles of the silane compound represented by the above general formula (a-1). When the quantity of water to be added is no less than 1.0 time by mole, it is possible to sufficiently increase the degree of hydrolysis and to facilitate the film-formation. On the other hand, it is possible to improve storage stability by suppressing gelation when the quantity of water is no greater than 10.0 times by mole.

In addition, when the silane compound represented by the general formula (a-1) is subjected to hydrolytic condensation, to use an acid catalyst and a base catalyst stepwise is preferred. Specifically, it is preferred that the aforementioned silane compound is charged in a solvent and the hydrolytic condensation reaction is allowed to proceed by stirring the mixture in the presence of an acid catalyst, followed by carrying out a certain treatment, and thereafter the hydrolytic condensation reaction is allowed to further proceed by stirring the hydrolytic condensate of the silane compound in the presence of a base catalyst.

The acid catalyst used in the hydrolytic condensation reaction is not particularly limited, and any one of conventionally used organic acids and inorganic acids can be employed. Herein, an organic carboxylic acid such as acetic acid, propionic acid, or butyric acid may be used as the organic acid. As the inorganic acid, hydrochloric acid, nitric acid, sulfuric acid, phosphoric acid and the like may be exemplified. The acid catalyst may be added either directly to a mixture of the alkoxysilane and water, or as an acidic aqueous solution with water.

The hydrolysis reaction of the silane compound described above is usually completed within about 5 hrs to 100 hrs at room temperature. Also, the reaction can be completed within a short reaction time period by allowing for the reaction by adding the acid catalyst or the base catalyst to an organic solvent containing one or more silane compounds represented by the above general formula (a-1) at a heating temperature of no lower than room temperature. Thus hydrolyzed silane compound thereafter causes a condensation reaction to form a network of Si—O—Si.

It is to be noted that water used in the hydrolytic condensation reaction, and alcohols yielded as by-products may be eliminated after completing the reaction if necessary. Accordingly, an excess reaction can be suppressed, and thus storage stability of the silica-based film forming material can be improved.

(b) Alkanolamine

The silica-based film forming material of the present invention contains an alkanolamine as the base catalyst described above. By including an alkanolamine, the crosslinking reaction of the siloxane polymer further proceeds from immediately after coating the silica-based film forming material with a spin coating method, whereby flowability of the silica-based film forming material is lost before filling the recessed parts formed on the semiconductor substrate or the semiconductor multilayer wiring substrate. Thus, the silica-based film forming material can be coated on the semiconductor substrate or the semiconductor multilayer wiring substrate without filling the recessed parts formed on the semiconductor substrate or the semiconductor multilayer wiring substrate.

The alkanolamine is not particularly limited, and may specifically includes monomethanolamine, monoethanolamine, monoisopropanolamine, monobutanolamine, diglycolamine, N-methylmethanolamine, N-ethylmethanolamine, N-propylmethanolamine, N-butylmethanolamine, N-methylethanolamine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, diethanolamine, diisopropanolamine, triethanolamine, triisopropanolamine, 3-amino-1,2-propanediol, 2-amino-1,3-propanediol, N,N-dimethylmethanolamine, N,N-diethylmethanolamine, N,N-dipropylmethanolamine, N,N-dibutylmethanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanolamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolamine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, or the like.

Among these, an alkanolamine having a primary amino group such as monomethanolamine, monoethanolamine, monoisopropanolamine, 3-amino-1,2-propanediol, 2-amino-1,3-propanediol or diglycolamine, or an alkanolamine having a secondary amino group such as N-methylethanolamine or N-aminoethylethanolamine is preferably used.

It is to be noted that the foregoing alkanolamines may be used either alone, or as a mixture of two or more thereof.

Content of Alkanolamine

The silica-based film forming material of the present invention preferably contains the alkanolamine in an amount of no less than 0.01% by mass and no greater than 10% by mass. By containing the alkanolamine at the aforementioned content, the silica-based film forming material can be coated on the semiconductor substrate or the semiconductor multilayer wiring substrate without deteriorating coating properties of the silica-based film forming material, and without filling the recessed parts formed on the semiconductor substrate or the semiconductor multilayer wiring substrate. The aforementioned content is more preferably no less than 0.1% by mass and no greater than 3% by mass.

(c) Organic Solvent

The silica-based film forming material of the present invention contains an organic solvent. By containing an organic solvent, favorable coating properties and capability of providing uniform film thickness of the silica-based film forming material can be achieved. As such an organic solvent, a generally known organic solvent for use in conventional silica-based film forming materials may be used. Specific examples of the organic solvent include monovalent alcohols such as methanol, ethanol, propanol, butanol, 3-methoxy-3-methyl-1-butanol, and 3-butoxy-1-butanol; alkylcarboxylate esters such as methyl-3-methoxypropionate, and ethyl-3-ethoxypropionate; polyhydric alcohols such as ethylene glycol, diethylene glycol, and propylene glycol; polyhydric alcohol derivatives such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, propylene glycol dimethyl ether, ethylene glycol monomethyl ether acetate, ethylene glycol monoethyl ether acetate, propylene glycol monomethyl ether acetate, and propylene glycol monoethyl ether acetate; ketones such as acetone, methyl ethyl ketone, and 2-heptanone; and the like. Of these, a monovalent alcohol, or a polyhydric alcohol may be preferably used. Also, these organic solvents may be used either alone, or as a mixture of two or more thereof.

Highly Volatile Organic Solvent

Furthermore, a highly volatile organic solvent is preferably added in the present invention. Addition of such a highly volatile organic solvent accelerates volatilization of the solvent immediately after coating the silica-based film forming material with a spin coating method, whereby a crosslinking reaction of the siloxane polymer, and lowering of flowability accompanied thereby can be still further promoted. As a result, it is possible to achieve a more favorable degree of opening and a more favorable shape of the air gaps formed by coating the silica-based film forming material. The organic solvent that satisfies the requirements as described above includes ethers such as dimethyl ether, diethyl ether, dipropyl ether, dibutyl ether, dihexyl ether, and propylene glycol dimethyl ether (1,2-dimethoxy propane); ketones such as acetone, methyl ethyl ketone, diethyl ketone, methyl propyl ketone, methyl isobutyl ketone, dimethyl ketone, diisobutyl ketone, methyl amyl ketone, diisopropyl ketone, cyclobutanone, cyclopentanone, and cyclohexanone; esters such as methyl lactate, ethyl lactate, methyl acetate, ethyl acetate, propyl acetate, butyl acetate, amyl acetate, isoamyl acetate, and propylene glycol monomethyl ether acetate; alcohols such as methanol, ethanol, butanol, and propanol. Of these, dibutyl ether, propylene glycol dimethyl ether (1,2-dimethoxy propane), methyl ethyl ketone, diethyl ketone, dimethyl ketone, diisobutyl ketone, propylene glycol monomethyl ether acetate, and ethanol are preferred.

Content of Organic Solvent

The content of the organic solvent, which is not particularly limited, is adjusted such that the concentration of the siloxane polymer becomes preferably no less than 0.5% by mass and no greater than 15% by mass, and more preferably no less than 1% by mass and no greater than 10% by mass. By adjusting the content of the organic solvent to fall within the above range, coating properties of the silica-based film forming material may be improved.

It is to be noted that when the aforementioned highly volatile organic solvent is added, the content of the organic solvent is preferably no less than 0.1% by mass and no greater than 50% by mass, and more preferably no less than 1% by mass and no greater than 40% by mass.

(d) Water

The silica-based film forming material of the present invention may contain water. Hydrolytic condensation of the hydrolyzable groups included in the siloxane polymer is enabled by the silica-based film forming material containing water, and thus it is possible to form air gaps with a great degree of opening on the semiconductor substrate or the semiconductor multilayer wiring substrate.

Content of Water

The content of water is preferably no less than 0.001% by mass and no greater than 10% by mass. When the content of water falls within the above range, the recessed parts formed on the semiconductor substrate or the semiconductor multilayer wiring substrate can be prevented from being filled with the silica-based film forming material when coated, while maintaining favorable coating properties of the silica-based film forming material. The content of water is more preferably no less than 0.05% by mass and no greater than 5% by mass.

(e) Acid

The silica-based film forming material of the present invention preferably contains an acid. The acid is not particularly limited, and any one of conventionally used organic acids and inorganic acids can be employed. As the organic acid, an organic carboxylic acid such as formic acid, acetic acid, propionic acid, butyric acid, lactic acid, maleic acid, or oxalic acid may be used. Examples of the inorganic acid include hydrochloric acid, nitric acid, sulfuric acid, phosphoric acid, and the like. When the silica-based film forming material contains the acid, an excessive crosslinking reaction of the siloxane polymer during storage is prevented, whereby storage stability of the silica-based film forming material can be improved.

The content of the acid in the silica-based film forming material of the present invention is preferably no less than 0.001% by mass and no greater than 10% by mass. When the content of the acid falls within the above range, the storage stability of the silica-based film forming material can be improved, without inhibiting the effects achieved by addition of the alkanolamine. The content of the acid is more preferably no less than 0.001% by mass and no greater than 5% by mass.

In addition, the acid is preferably contained such that the silica-based film forming material of the present invention has a pH of no less than 3 and no greater than 7. When the silica-based film forming material has a pH falling within the above range, the storage stability of the silica-based film forming material can be improved, without inhibiting the effects achieved by addition of the alkanolamine.

Other Components

To the silica-based film forming material of the present invention may be added other resin components and various types of additives in a range that does not impair the effects of the present invention. The additive, which is not particularly limited may be, for example, an organic base or an inorganic base, which has been conventionally employed as a base catalyst for hydrolytic condensation of silane compounds, other than the alkanolamine.

Examples of the organic base include quaternary ammonium hydroxides such as tetramethylammonium hydroxide, tetraethylammonium hydroxide, tetrapropylammonium hydroxide, tetrabutylammonium hydroxide, methyltripropylammonium hydroxide, methyltributylammonium hydroxide, and choline; silazane compounds such as hexamethyldisilazane, and hexaethyldisilazane; aminosilane compounds such as trimethylsilyldimethylamine, and trimethylsilyldiethylamine; hydroxylamine compounds such as hydroxylamine, and diethylhydroxylamine; and other nitrogen-containing compounds such as methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, dimethylaminopropylamine, 2-ethylhexylamine, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, and hydrazine.

Examples of the inorganic base include ammonia, sodium hydroxide, potassium hydroxide, barium hydroxide, calcium hydroxide, and the like.

The aforementioned base catalyst may be used either alone, or as a mixture of two or more thereof.

In addition, a silane compound that serves as a constitutional unit of the siloxane polymer may be also added. Such a silane compound is exemplified by 3-(trimethoxysilyl)propyl methacrylate, 3-aminopropyltriethoxysilane, and the like.

Furthermore, for improving the strength of the silica-based film after baking, a compound of an alkali metal or an alkaline earth metal in the periodic table of elements may be also added. Examples of the metal compound include oxalates, lactates and the like of potassium, rubidium, cesium, beryllium, magnesium, calcium, strontium and barium.

Method for Preparation of Silica-Based Film Forming Material

The method for preparation of the silica-based film forming material of the present invention includes: preparing a mother liquor containing the siloxane polymer and the organic solvent (mother liquor preparation step); adding to the mother liquor the alkanolamine, the additive and the like (addition step); and thereafter adding the organic solvent as a dilution solvent (dilution step). Moreover, the method for preparation of the silica-based film forming material of the present invention may further have an acid addition step following the dilution step.

Mother Liquor Preparation Step

In the mother liquor preparation step, the siloxane polymer is synthesized by subjecting the silane compound to hydrolytic condensation in the organic solvent, whereby a mother liquor of a silica-based film forming material is prepared. After the synthesis of the siloxane polymer, water used in the hydrolytic condensation reaction and alcohols yielded as by-products may be eliminated. Furthermore, after eliminating water and the alcohols, the organic solvent may be further added for adjusting the concentration of the mother liquor.

The content of the organic solvent in the mother liquor, which is not particularly limited, may be adjusted such that the concentration of the siloxane polymer (mother liquor polymer concentration) becomes preferably no less than 5% by mass and no greater than 30% by mass, and more preferably no less than 8% by mass and no greater than 25% by mass. It is to be noted that the highly volatile organic solvent as the organic solvent is preferably added not in this mother liquor preparation step, but in the following dilution step.

Addition Step

In the addition step, the alkanolamine is added to the mother liquor, and further water, additives and the like are optionally added. In the addition step, the alkanolamine and the like are added to the mother liquor, and the mixture is stirred. The stirring time period, which is not particularly limited, may be preferably not shorter than 20 min and not longer than 120 min.

Dilution Step

In the dilution step, the mother liquor to which the alkanolamine and the like has been added is diluted by adding the organic solvent thereto to prepare a silica-based film forming material. The quantity of the added organic solvent, which is not particularly limited, may be adjusted such that the concentration of the siloxane polymer (final polymer concentration) becomes preferably no less than 0.5% by mass and no greater than 15% by mass, and more preferably no less than 1% by mass and no greater than 10% by mass. When the acid is added in the following step, the final polymer concentration after adding the acid preferably falls within the above range.

Acid Addition Step

The method for preparation of the silica-based film forming material of the present invention preferably includes an acid addition step as needed. Herein, the acid addition step means a step of adding the acid to the silica-based film forming material following the dilution step. By thus adding the acid, an excessive crosslinking reaction of the siloxane polymer during storage is prevented, whereby storage stability of the silica-based film forming material can be improved.

Method for Forming Air Gaps

The method for forming air gaps of the present invention includes: coating the silica-based film forming material of the present invention with a spin coating method on a semiconductor substrate or a semiconductor multilayer wiring substrate having recessed parts (coating step); and baking to form a silica-based film (baking step). In addition, the method for forming air gaps of the present invention may optionally include a heating step between the coating step and the baking step. Moreover, the method may further include an ultraviolet ray irradiation step prior to or concurrently with the baking step.

Coating Step

In the coating step, the silica-based film forming material of the present invention is coated on a semiconductor substrate or a semiconductor multilayer wiring substrate having recessed parts to form a coated film. Herein, as a process for forming a coated film by coating the silica-based film forming material on a substrate, a spin coating method is employed. In the method for forming air gaps of the present invention, air gaps can be formed even if a spin coating method is employed since a certain silica-based film forming material is used.

In this respect, a dynamic dispense method in which a coating liquid is dropped in the state of a semiconductor substrate or a semiconductor multilayer wiring substrate being rotated to form a coated film, and a static dispense method in which a coating liquid is dropped in the state of a semiconductor substrate or a semiconductor multilayer wiring substrate being static, followed by rotating the semiconductor substrate or the semiconductor multilayer wiring substrate to form a coated film have been known as the spin coating method, in general. In the method for forming air gaps of the present invention, any one of the dynamic dispense method and the static dispense method may be employed as the spin coating method; however, the dynamic dispense method is preferably employed in light of the more certain inhibition of filling of the recessed parts formed on the semiconductor substrate or the semiconductor multilayer wiring substrate.

The semiconductor substrate and the semiconductor multilayer wiring substrate to be a subject of application of the method for forming air gaps of the present invention is a silicon wafer on which a wiring layer, an insulating layer and/or the like are(is) formed as needed. In this regard, the recessed parts formed on the semiconductor substrate and semiconductor multilayer wiring substrate may be provided by a conventionally well-known procedure.

Heating Step

The method for forming air gaps of the present invention preferably includes a heating step as needed. The heating step herein means a step of drying the coated film after the silica-based film forming material of the present invention was coated on the semiconductor substrate or the semiconductor multilayer wiring substrate. During the heating step, the condensation reaction of the hydroxyl groups included in the siloxane polymer also proceeds, thereby resulting in formation of a compact coated film.

Although the heating temperature in the heating step is not particularly limited, it is preferably no lower than 80° C. and no higher than 200° C. The heating time period is not also particularly limited and is preferably not shorter than 30 sec and not longer than 300 sec, and more preferably not shorter than 60 sec and not longer than 180 sec.

Baking Step

The baking step is a step for forming a silica-based film by baking the coated film after heating. In the baking step, the condensation reaction of the hydroxyl groups included in the siloxane polymer is allowed to proceed, thereby forming a dense Si—O—Si network. It is to be noted that although this condensation reaction proceeds also in the aforementioned heating step, it can further proceed in the baking step, whereby a more compact silica-based film can be formed.

Although the baking temperature in the baking step is not particularly limited, it is preferably no lower than 350° C. and no higher than 700° C., and more preferably no lower than 400° C. and no higher than 600° C. Also the baking time period is not particularly limited, and when a common baking furnace is used, it is preferably not shorter than 10 min and not longer than 2 hrs, and more preferably not shorter than 20 min and not longer than 1 hour. In addition, when a rapid thermal processing apparatus is used, the baking time period is preferably not shorter than 10 sec and not longer than 10 min.

Ultraviolet Ray Irradiation Step

The method for forming air gaps of the present invention may include an ultraviolet ray irradiation step prior to or concurrently with the baking step. Irradiation with an ultraviolet ray enables a more compact and strong silica-based film to be formed, and thus the mechanical strength of the film can be enhanced.

Since the silica-based film forming material of the present invention contains (a) a certain siloxane polymer, (b) an alkanolamine, and (c) an organic solvent, formation of air gaps is enabled without filling the recessed parts even when the material is coated with a spin coating method.

When the air gap formed according to the present invention is damaged by a processing process and the like, a repairing step may be carried out. For example, processing processes such as etching and ashing may damage the coated film, whereby the film may be deteriorated. Specifically, hydrophobic groups (Si—$CH_3$, etc.) of the siloxane polymer may be degraded to cause silanolation. Thus, in the repairing step, silylation executed using hexamethyldisilazane (HMDS), trimethylsilyldimethylamine (TMSDMA), methyltriethoxysilane (MTES), methyltrimethoxysilane (MTMS) or the like may repair such damages.

EXAMPLES

Examples of the present invention will be explained hereafter in detail with reference to drawings. The present invention is not in any way limited by the following Examples.

Examples 1 to 39, and Comparative Examples 2 to 6

The silane compounds shown in Table 1 to Table 7 were subjected to hydrolytic condensation by mixing in propylene glycol monopropyl ether (PGP) at molar ratios shown in the Tables, whereby siloxane polymers having a mass average molecular weight of about 2,000 were prepared. In addition, after carrying out concentration and adjustment for eliminating water and alcohols yielded as by-products, PGP was added to prepare mother liquors having concentrations of the polymer as shown in Table 1 to Table 7.

To these solutions was added the alkanolamine or the base catalyst shown in Table 1 to Table 7 so as to give final concentrations shown in Table 1 to Table 7, followed by stirring the mixture for about 40 min. It is to be noted that in Examples 2, 4, 5, 12, 14, 15 and 28, other components shown in Table 1 to Table 4 were added, respectively, along with addition of the alkanolamine.

Thereafter, the dilution solvents shown in Table 1 to Table 7 were added, respectively, to these solutions so as to give final concentrations shown in Table 1 to Table 7, followed by stirring the mixture. Furthermore, the acids shown in Table 1 to Table 7 were added to these solutions, respectively, so as to give final concentrations shown in Table 1 to Table 7, followed by stirring the mixture to obtain silica-based film forming materials having a final polymer concentration and a pH as shown in Table 1 to Table 7. Note that the mass average molecular weight and the dispersity index of the siloxane polymers are also shown in Table 1 to Table 7.

Comparative Example 1

As a commercially available silica-based film forming material, "OCD T-7" (product name, manufactured by Tokyo Ohka Kogyo Co., Ltd.) was provided. This silica-based film forming material does not contain an alkanolamine.

TABLE 1

|  | Example 1 | Example 2 | Example 3 | Example 4 | Example 5 | Example 6 | Example 7 |
|---|---|---|---|---|---|---|---|
| silane compound | TEOS/MTES = 2/8 | TEOS/MTES = 2/8 | TMOS/MTMS = 2/8 | TMOS/MTMS = 2/8 | TMOS/MTMS = 2/8 | TEOS/MTES = 2/8 | TEOS/MTES = 2/8 |
| mother liquor polymer concentration (w.t. %) | 16 | 16 | 20 | 20 | 20 | 16 | 16 |
| alkanolamine (w.t. %) | MEA (0.8) | MEA (0.6) | MEA (0.8) | MEA (0.6) | MEA (0.6) | MMA (2.0) | MEA (1.0) |
| other component (w.t. %) | — | TMSDMA (0.4) | — | TMSDMA (0.4) | $H_2O$ (5) | — | — |
| dilution solvent (w.t. %) | EtOH (20) PGP (28) | EtOH (10) PGP (51) | EtOH (20) PGP (38) | EtOH (10) PGP (58) | EtOH (10) PGP (54) | EtOH (17) PGP (42) | PGMEA (30) PGP (43) |
| acid (w.t. %) | AcOH (0.8) | AcOH (0.8) | AcOH (0.8) | AcOH (0.8) | AcOH (0.8) | AcOH (1.6) | AcOH (1.0) |
| final polymer concentration (w.t. %) | 8 | 6 | 8 | 6 | 6 | 6 | 4 |
| mass average molecular | 10000 | 11000 | 13000 | 14000 | 14000 | 6000 | 7000 |

TABLE 1-continued

|  | Example 1 | Example 2 | Example 3 | Example 4 | Example 5 | Example 6 | Example 7 |
|---|---|---|---|---|---|---|---|
| weight dispersity index | 1.8 | 2.9 | 2.0 | 3.0 | 2.7 | 1.8 | 2.0 |
| pH | 5 | 6 | 5 | 6 | 6 | 6 | 5 |

TABLE 2

|  | Example 8 | Example 9 | Example 10 | Example 11 | Example 12 | Example 13 | Example 14 |
|---|---|---|---|---|---|---|---|
| silane compound | TEOS/MTES = 2/8 | TEOS/MTES = 2/8 | TEOS/MTES = 2/8 | TEOS/MTES = 2/8 | TEOS/MTES = 2/8 | TEOS/MTES = 2/8 | TEOS/MTES = 2/8 |
| mother liquor polymer concentration (w.t. %) | 16 | 16 | 16 | 16 | 16 | 16 | 16 |
| alkanolamine (w.t. %) | MEA (1.0) | AEEA (2.0) | MIPA (2.0) | DGA (2.0) | MEA (1.0) | MEA (1.0) | MEA (1.0) |
| other component (w.t. %) | — | — | — | — | TMAH (0.1) | — | LS3380 (0.5) |
| dilution solvent (w.t. %) | EtOH (17) PGP (44) | EtOH (17) PGP (43) | EtOH (17) PGP (43) | EtOH (17) PGP (43) | EtOH (17) PGP (43) | EtOH (17) PGP (56) | EtOH (17) PGP (43) |
| acid (w.t. %) | AcOH (1.0) | AcOH (1.0) | AcOH (1.0) | AcOH (1.0) | AcOH (1.0) | AcOH (1.0) | AcOH (1.0) |
| final polymer concentration (w.t. %) | 6 | 6 | 6 | 6 | 6 | 4 | 6 |
| mass average molecular weight | 11200 | 10000 | 7300 | 14400 | 12400 | 9400 | 9600 |
| dispersity index | 2.5 | 2.1 | 2.0 | 2.9 | 3.1 | 2.3 | 2.1 |
| pH | 6 | 7 | 7 | 7 | 7 | 6 | 6 |

TABLE 3

|  | Example 15 | Example 16 | Example 17 | Example 18 | Example 19 | Example 20 | Example 21 |
|---|---|---|---|---|---|---|---|
| silane compound | TEOS/MTES = 2/8 | TEOS/MTES/DMDMS = 2/7/1 | TEOS/MTES = 2/8 | TEOS/MTES = 2/8 | TEOS/MTES = 2/8 | TEOS/MTES = 2/8 | TEOS/MTES = 2/8 |
| mother liquor polymer concentration (w.t. %) | 16 | 16 | 16 | 16 | 16 | 16 | 16 |
| alkanolamine (w.t. %) | MEA (1.0) | MEA (1.0) | MEA (1.0) | MEA (0.8) | MEA (0.8) | MEA (0.8) | MEA (0.8) |
| other component (w.t. %) | LS3150 (0.8) | — | — | — | — | — | — |
| dilution solvent (w.t. %) | EtOH (17) PGP (55) | EtOH (17) PGP (56) | EtOH (18) PGP (56) | DIBK (25) EtOH (4) PGP (50) | DBE (25) EtOH (4) PGP (44) | MMPOM (25) EtOH (4) PGP (44) | DBE (25) EtOH (4) PGP (44) |
| acid (w.t. %) | AcOH (1.0) | AcOH (1.0) | HNO$_3$ (1.50*10$^{-4}$) | AcOH (1.0) | AcOH (1.0) | AcOH (1.0) | AcOH (2.0) |
| final polymer concentration (w.t. %) | 4 | 4 | 4 | 3 | 4 | 4 | 4 |
| mass average molecular weight | 9800 | 7000 | 9600 | 9000 | 9200 | 8900 | 9400 |
| dispersity index | 2.4 | 2.0 | 1.9 | 2.0 | 2.2 | 2.0 | 2.0 |
| pH | 6 | 5 | 3 | 5 | 5 | 5 | 5 |

TABLE 4

| | Example 22 | Example 23 | Example 24 | Example 25 | Example 26 | Example 27 | Example 28 |
|---|---|---|---|---|---|---|---|
| silane compound | TEOS/MTES = 4/6 | TEOS/MTES = 4/6 | TEOS/MTES = 4/6 | TEOS/MTES = 3/7 | TEOS/MTES = 2/8 | TEOS/MTES = 2/8 | TEOS/MTES = 2/8 |
| mother liquor polymer concentration (w.t. %) | 16 | 16 | 16 | 16 | 16 | 16 | 16 |
| alkanolamine (w.t. %) | MEA (0.8) | MEA (0.7) | MEA (0.6) | MEA (0.6) | MEA (0.8) | MEA (0.8) | MEA (0.8) |
| other component (w.t. %) | — | — | — | — | — | — | RbNO3 (20 ppm) |
| dilution solvent (w.t. %) | DBE (15) PGP (71) | DBE (15) PGP (75) | DBE (15) PGP (58) | DBE (15) PGP (58) | DBE (10) PGME (30) PGP (32) | DBE (10) PGME (20) PGP (39) | DBE (25) EtOH (4) PGP (40) |
| acid (w.t. %) | AcOH (1.0) HNO$_3$ (5 ppm) | AcOH (2.0) HNO$_3$ (5 ppm) | AcOH (1.0) HNO$_3$ (5 ppm) | lactic acid (1.5) | AcOH (2.0) | AcOH (5.0) | AcOH (5.0) |
| final polymer concentration (w.t. %) | 2 | 1.2 | 4 | 4 | 4 | 4 | 4 |
| mass average molecular weight | 6800 | 6500 | 9200 | 16500 | 14400 | 14000 | 14600 |
| dispersity index | 2.2 | 1.9 | 2.3 | 2.8 | 2.6 | 2.6 | 2.9 |
| pH | 5 | 5 | 5 | 5 | 5 | 5 | 5 |

TABLE 5

| | Example 29 | Example 30 | Example 31 | Example 32 | Example 33 | Example 34 | Example 35 |
|---|---|---|---|---|---|---|---|
| silane compound | TEOS/MTES = 3/7 | TEOS/MTES = 3/7 | TEOS/MTES = 3/7 | TEOS/MTES = 3/7 | TEOS/MTES/DMDMS = 3/7/0.3 | TEOS/MTES = 2/8 | TEOS/MTES = 2/8 |
| mother liquor polymer concentration (w.t. %) | 16 | 16 | 16 | 16 | 16 | 16 | 16 |
| alkanolamine (w.t. %) | MEA (0.7) | MEA (0.7) | MEA (0.7) | MMA (1.5) | MEA (0.7) | MEA (0.8) | MEA (0.8) |
| other component (w.t. %) | — | — | — | — | — | — | — |
| dilution solvent (w.t. %) | DBE (15) PGP (57) | DBE (15) PGP (75) | DBE (5) PGME (15) PGP (70) | DBE (20) PGP (52) | DBE (15) PGP (57) | DBE (25) PGP (44) | PGP (69) |
| acid (w.t. %) | AcOH (2.0) | AcOH (2.0) HNO3 (2.5 ppm) | AcOH (2.0) | AcOH (2.0) | AcOH (2.0) | AcOH (5.0) | AcOH (5.0) |
| final polymer concentration (w.t. %) | 4 | 1.2 | 1.2 | 4 | 4 | 4 | 4 |
| mass average molecular weight | 8300 | 7400 | 7500 | 7000 | 7500 | 14200 | 14400 |
| dispersity index | 1.8 | 1.9 | 1.9 | 1.9 | 1.9 | 2.3 | 2.3 |
| pH | 5 | 5 | 5 | 5 | 5 | 5 | 5 |

TABLE 6

| | Example 36 | Example 37 | Example 38 | Example 39 |
|---|---|---|---|---|
| silane compound | TEOS/MTMS = 2/8 | TEOS/MTES = 3/7 | TEOS/MTES = 3/7 | TEOS/MTES = 4/6 |
| mother liquor polymer concentration (w.t. %) | 16 | 16 | 16 | 16 |

TABLE 6-continued

|  | Example 36 | Example 37 | Example 38 | Example 39 |
|---|---|---|---|---|
| alkanolamine (w.t. %) | MEA (0.7) | MEA (0.7) | MEA (0.7) | MEA (0.7) |
| other component (w.t. %) | — | — | — | — |
| dilution solvent (w.t. %) | PGP (69) | DBE (5) PGP (82) | PGP (87) | DBE (15) PGP (76) |
| acid (w.t. %) | AcOH (5.0) | AcOH (5.0) | AcOH (5.0) | AcOH (2.0) |
| final polymer concentration (w.t. %) | 4 | 1.2 | 1.2 | 1.0 |
| mass average molecular weight | 13500 | 8300 | 8300 | 6500 |
| dispersity index | 2.2 | 1.7 | 1.7 | 1.9 |
| pH | 5 | 5 | 5 | 5 |

PGMEA: propylene glycol monomethyl ether acetate

TABLE 7

|  | Comparative Example 2 | Comparative Example 3 | Comparative Example 4 | Comparative Example 5 | Comparative Example 6 |
|---|---|---|---|---|---|
| silane compound | TEOS/MTMS = 2/8 | TEOS/MTES = 2/8 | TEOS/MTES = 2/8 | TEOS/MTES = 2/8 | TEOS/MTES = 2/8 |
| mother liquor polymer concentration (w.t. %) | 20 | 16 | 16 | 16 | 16 |
| base catalyst (w.t. %) | TMAH (0.3) | TMAH (0.15) | DEHA (10) | diethylamine (2.0) | cyclohexylamine (2.0) |
| other component (w.t. %) | — | — | — | — | — |
| dilution solvent (w.t. %) | EtOH (6) PGP (73) | EtOH (6) PGP (68) | EtOH (6) PGP (58) | EtOH (6) PGP (66) | EtOH (6) PGP (66) |
| acid (w.t. %) | AcOH (1.0) | AcOH (1.0) | AcOH (1.0) | AcOH (1.0) | AcOH (1.0) |
| final polymer concentration (w.t. %) | 4 | 4 | 4 | 4 | 4 |
| mass average molecular weight | 56000 | 25400 | 3500 | 11000 | 133000 |
| dispersity index | 7.2 | 5.2 | 1.3 | 2.8 | 11 |
| pH | 5 | 5 | 5 | 6 | 6 |

Abbreviations employed in Table 1 to Table 7 are as in the following.
TEOS: tetraethoxysilane
MTMS: methyltrimethoxysilane
MTES: methyltriethoxysilane
DMDMS: dimethyldimethoxysilane
TMOS: tetramethoxysilane
MTES: methyltriethoxysilane
MEA: monoethanolamine
MMA: N-methylmethanolamine
AEEA: N-aminoethylethanolamine
MIPA: monoisopropanolamine
DGA: diglycolamine
TMAH: tetramethylammonium hydroxide
DEHA: diethylhydroxylamine
TMSDMA: trimethylsilyldimethylamine
LS3380: 3-(trimethoxysilyl)propyl methacrylate
LS3150: 3-aminopropyltriethoxysilane
EtOH: ethanol
DIBK: diisobutyl ketone
DBE: dibutyl ether
MMPOM: propylene glycol dimethyl ether (1,2-dimethoxy propane)
AcOH: acetic acid Evaluation 1

Figure 1:
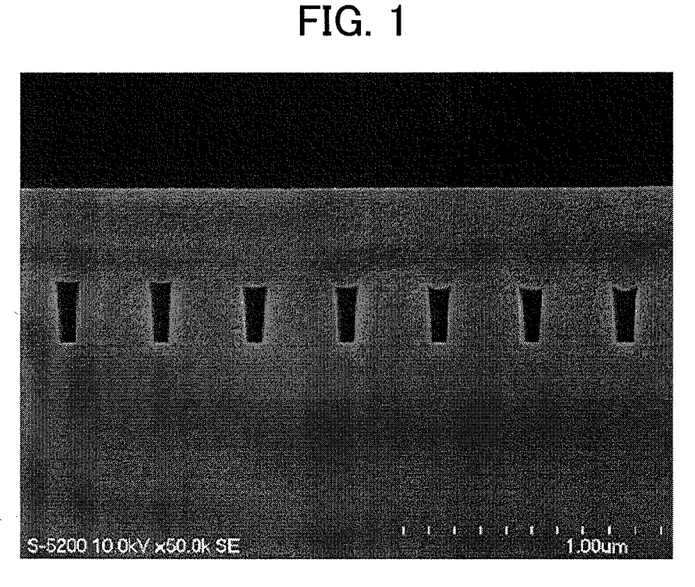
FIG. 1 shows a cross sectional view illustrating a silica-based film formed by Example of the present invention.
Figure 2:
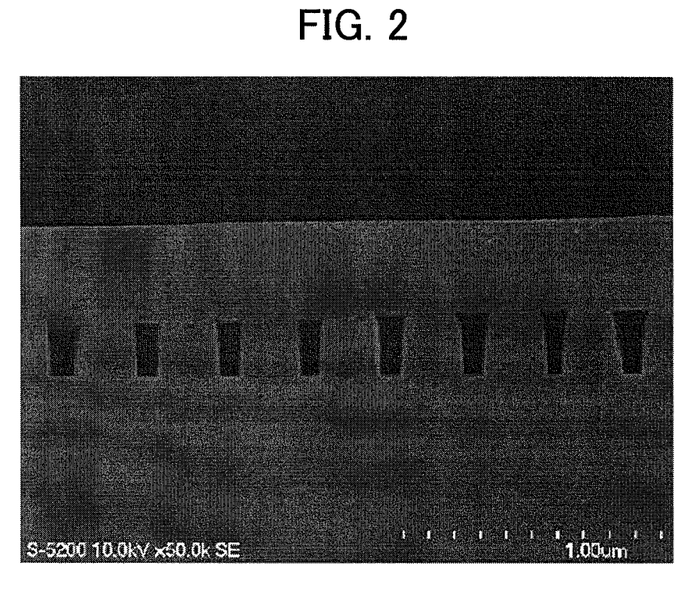
FIG. 2 shows a cross sectional view illustrating a silica-based film formed by Example of the present invention.
Figure 3:
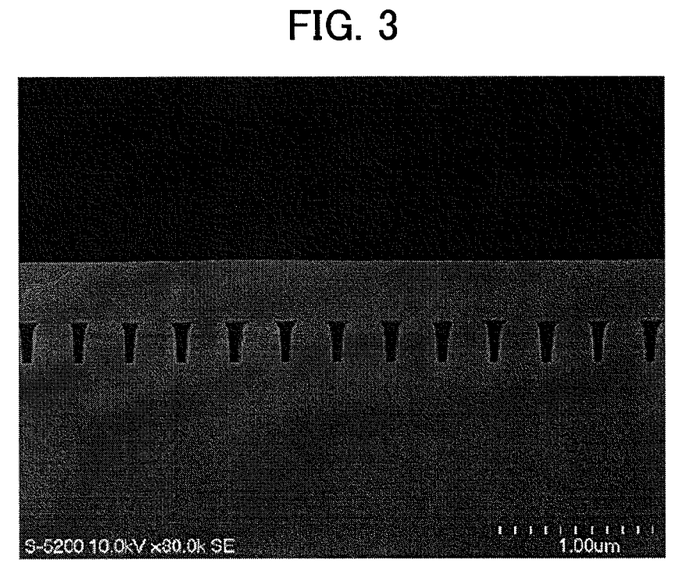
FIG. 3 shows a cross sectional view illustrating a silica-based film formed by Example of the present invention.
Figure 4:
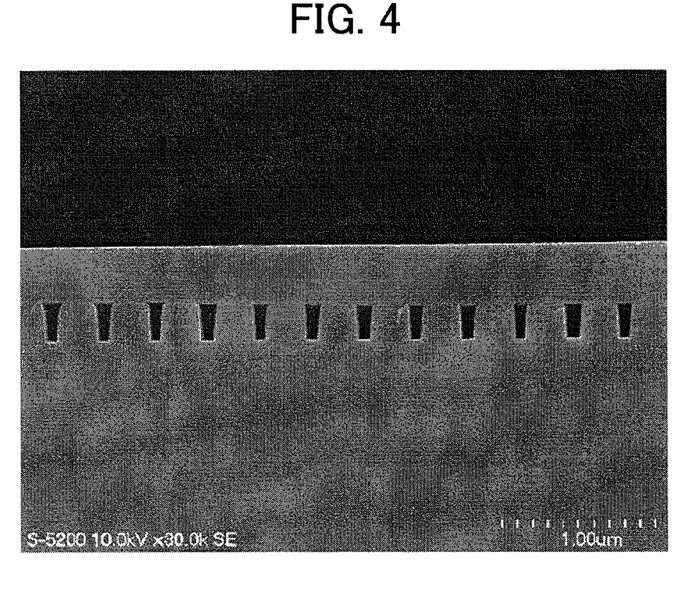
FIG. 4 shows a cross sectional view illustrating a silica-based film formed by Example of the present invention.
Figure 5:
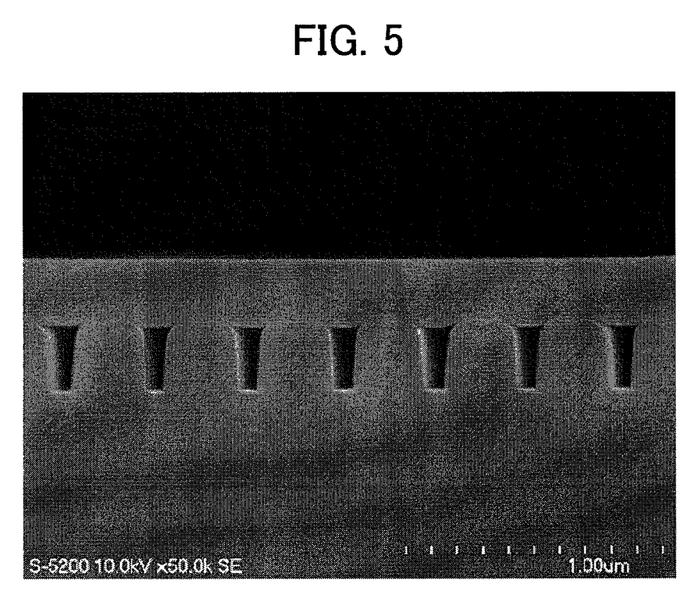
FIG. 5 shows a cross sectional view illustrating a silica-based film formed by Example of the present invention.
Figure 6:
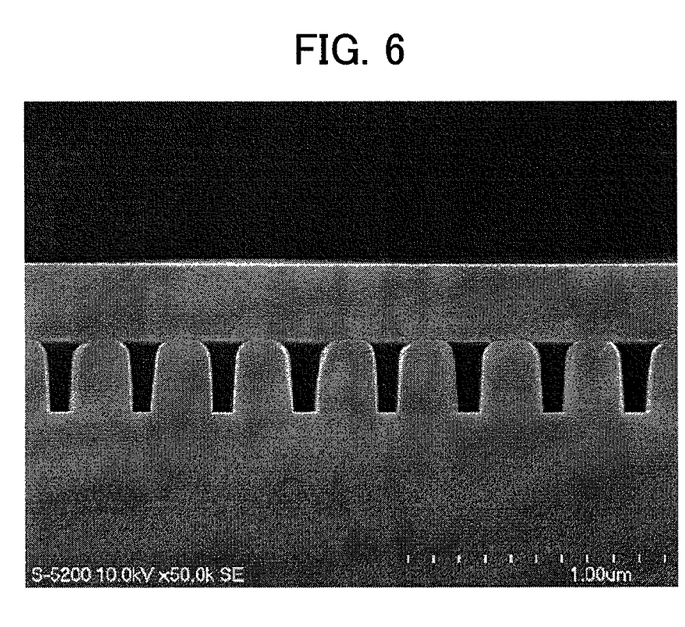
FIG. 6 shows a cross sectional view illustrating a silica-based film formed by Example of the present invention.
Figure 7:
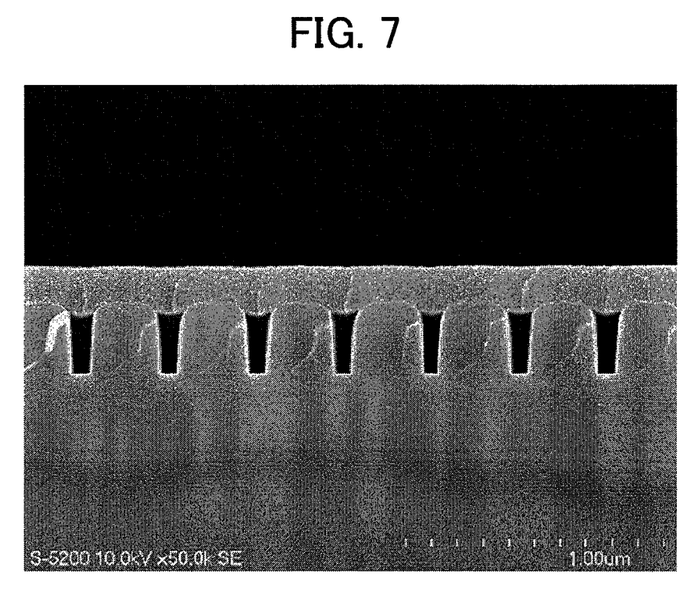
FIG. 7 shows a cross sectional view illustrating a silica-based film formed by Example of the present invention.
Figure 8:
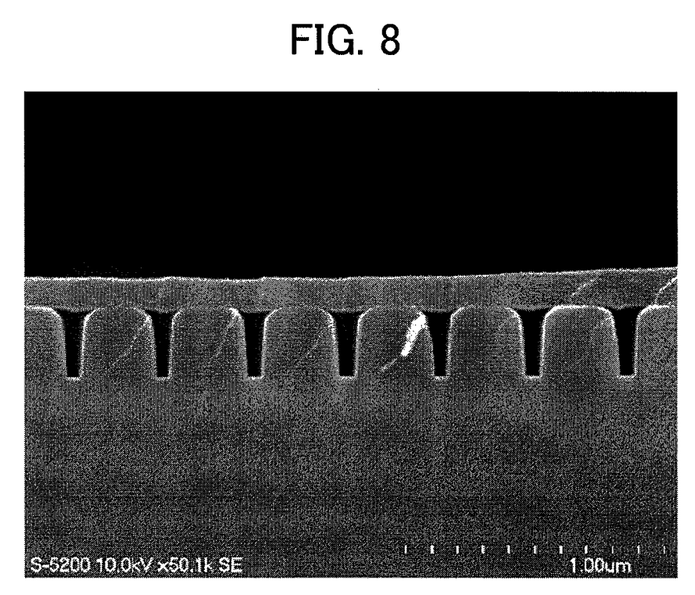
FIG. 8 shows a cross sectional view illustrating a silica-based film formed by Example of the present invention.
Figure 9:
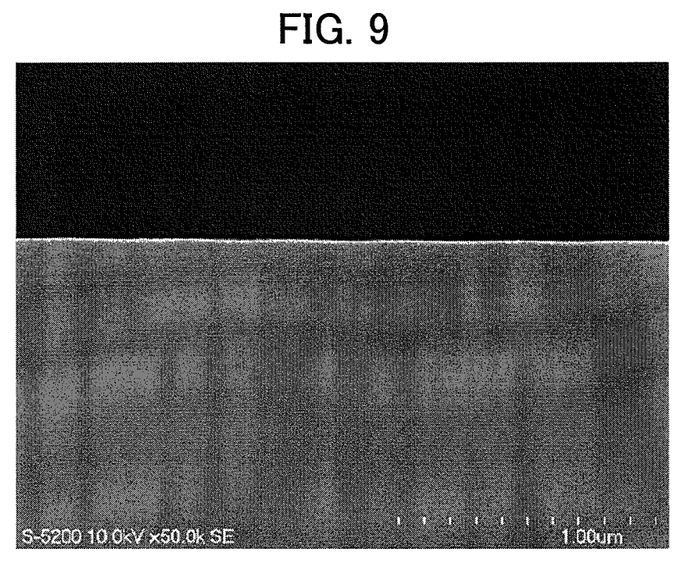
FIG. 9 shows a cross sectional view illustrating a silica-based film formed by Comparative Example of the present invention.
Figure 10:
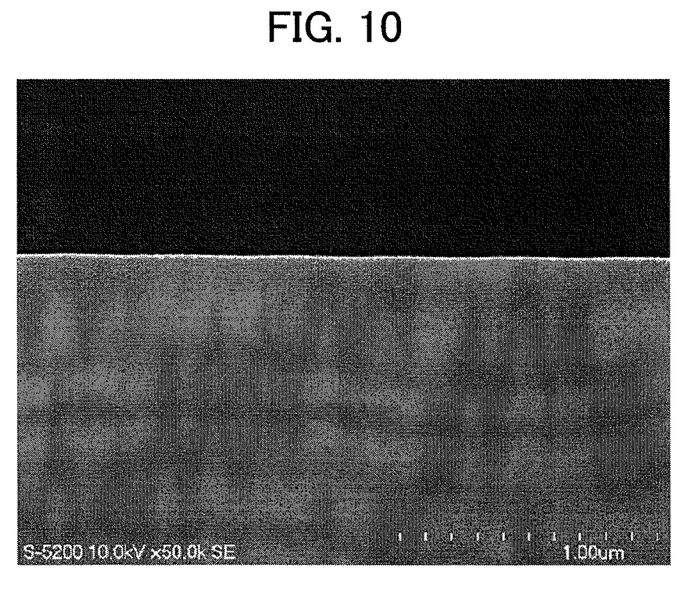
FIG. 10 shows a cross sectional view illustrating a silica-based film formed by Comparative Example of the present invention.

The silica-based film forming materials of Examples 1 to 39, and the silica-based film forming materials of Comparative Examples 1 to 6 were each coated with a dynamic dispense method on a semiconductor substrate having a 50 to 150 nm trench pattern. Specifically, the silica-based film forming material was coated using "SS8261" (product name, manufactured by Tokyo Ohka Kogyo Co., Ltd.) while rotating the semiconductor substrate at 500 rpm, and rotation at 1,000 to 2,000 rpm was permitted for 20 to 40 sec. Thereafter, the obtained coated film was dried by heating at 150° C. for 60 sec, and then baked using "TS8000" (product name, manufactured by Tokyo Ohka Kogyo Co., Ltd.) in a nitrogen atmosphere at 400° C. for 30 min. This semiconductor substrate was cut such that the trench pattern was vertically broken. Accordingly, the fracture cross section was observed with a scanning electron microscope. The results decided according to the following criteria from the results of observation are shown in Table 8. In addition, micrographs of cross sections of trench patterns observed in Examples 1 to 7 and 17 are shown in FIGS. 1 to 8, respectively, and micrographs of cross sections of trench patterns observed in Comparative Examples 1 and 3 are shown in FIGS. 9 and 10, respectively.

A: air gap formed
B: air gap not formed

TABLE 8

|  | Evaluation |
|---|---|
| Example 1 | A |
| Example 2 | A |
| Example 3 | A |
| Example 4 | A |
| Example 5 | A |
| Example 6 | A |
| Example 7 | A |
| Example 8 | A |
| Example 9 | A |
| Example 10 | A |
| Example 11 | A |
| Example 12 | A |
| Example 13 | A |
| Example 14 | A |
| Example 15 | A |
| Example 16 | A |
| Example 17 | A |
| Example 18 | A |
| Example 19 | A |
| Example 20 | A |
| Example 21 | A |
| Example 22 | A |
| Example 23 | A |
| Example 24 | A |
| Example 25 | A |
| Example 26 | A |
| Example 27 | A |
| Example 28 | A |
| Example 29 | A |
| Example 30 | A |
| Example 31 | A |
| Example 32 | A |
| Example 33 | A |
| Example 34 | A |
| Example 35 | A |
| Example 36 | A |
| Example 37 | A |
| Example 38 | A |
| Example 39 | A |
| Comparative Example 1 | B |
| Comparative Example 2 | B |
| Comparative Example 3 | B |
| Comparative Example 4 | B |
| Comparative Example 5 | B |
| Comparative Example 6 | B |

As is clear from Table 8 and FIGS. 1 to 10, when the silica-based film forming materials of Examples 1 to 39 in which the alkanolamine was used were coated on the semiconductor substrate, air gaps with a great degree of opening were formed. On the other hand, when the silica-based film forming materials of Comparative Examples 1 to 6 to which an alkanolamine was not added were coated on the semiconductor substrate, the trench pattern was completely filled, leading to failure in formation of the air gap. From the foregoing results, it is revealed that air gaps can be suitably formed when the silica-based film forming material of the present invention was used, even with a spin coating method.

Evaluation 2

The silica-based film forming material of Example 24 was coated with a dynamic dispense method on a silicon wafer. Specifically, the silica-based film forming material was coated using "SS8261" (manufactured by Tokyo Ohka Kogyo Co., Ltd.) while rotating a 6-inch silicon wafer at 500 rpm, and rotation at 1,000 to 1,500 rpm was permitted for 20 to 40 sec. Thereafter, the obtained coated film was dried by heating at 200° C. for 60 sec. A similar step was repeated to produce two pieces of wafer on which a coated film having a film thickness of 400 nm was formed. One of the two pieces of wafer was irradiated with an ultraviolet ray of a broad band wavelength using "SS8261" (product name, manufactured by Tokyo Ohka Kogyo Co., Ltd.) on a hot plate at 100° C. for 2 min. Thereafter, the two pieces of wafer were baked using "TS8000" (product name, manufactured by Tokyo Ohka Kogyo Co., Ltd.) in a nitrogen atmosphere at 400° C. for 30 min, and were subjected to measurement of the modulus of elasticity and the hardness of the silica-based film using "DCM-SA2" (product name, manufactured by MTS Systems Corporation). The results are shown in Table 9.

TABLE 9

|  | modulus of elasticity (GPa) | hardness (GPa) |
|---|---|---|
| irradiated with UV | 8.8 | 0.51 |
| unirradiated with UV | 4.8 | 0.27 |

As is clear from Table 9, the modulus of elasticity and the hardness of the silica-based film were improved when irradiation with an ultraviolet ray was carried out before baking, as compared with the case in which the irradiation was not carried out. From these results, it is revealed that the mechanical strength of the silica-based film is enhanced by irradiation with an ultraviolet ray.

What is claimed is:

1. A method for forming air gaps comprising:
applying by a spin coating method a silica-based film forming material on a semiconductor substrate having recessed parts, the film forming material consisting of as separate components:
(a) a siloxane polymer prepared by subjecting a first silane compound to hydrolytic condensation;
(b) an alkanolamine in an amount of 0.01% to 10% by mass;
(c) an organic solvent;
(d) optionally water;
(e) optionally an acid; and
(f) optionally a second silane compound
wherein the first silane compound is represented by the following general formula:

wherein $R^1$ represents a hydrogen atom or an alkyl group or an aryl group having 1 to 20 carbon atoms, $R^2$ represents a monovalent organic group, and n represents an integer of no less than 0 and no greater than 2; and baking the coated semiconductor substrate to form a silica-based film thereon, thereby covering the recessed parts to form the air gaps;
wherein the alkanolamines are contained in the silica-based film forming material; and wherein a cross-linking reaction of the siloxane polymer progresses immediately after coating, and the liquidity of the silica-based film forming material declines prior to filling the recessed parts.

2. The method for forming air gaps according to claim 1, wherein the siloxane polymer has a mass average molecular weight of no less than 3,000 and no greater than 1,000,000.

3. The method for forming air gaps according to claim 1, wherein the siloxane polymer has a dispersity index of greater than 1.0 and no greater than 10.

4. The method for forming air gaps according to claim 1 having a pH of no less than 3 and no greater than 7.

5. The method for forming air gaps according to claim 1, wherein the spin coating method is a dynamic dispense method.

6. A method for forming air gaps comprising:
applying by a spin coating method a silica-based film forming material on a semiconductor multilayer wiring substrate having recessed parts, the film forming material consisting of as separate components:
  (a) a siloxane polymer prepared by subjecting a first silane compound to hydrolytic condensation;
  (b) an alkanolamine in an amount of 0.01% to 10% by mass;
  (c) an organic solvent;
  (d) optionally water;
  (e) optionally an acid; and
  (f) optionally a second silane compound
wherein the first silane compound is represented by the following general formula:

$$R^1{}_n Si(OR^2)_{4-n}$$

wherein $R^1$ represents a hydrogen atom, or an alkyl group or an aryl group having 1 to 20 carbon atoms; $R^2$ represents a monovalent organic group; and n represents an integer of no less than 0 and no greater than 20; and baking the coated semiconductor multilayer wiring substrate to form a silica-based film thereon, thereby covering the recessed parts to form the air gaps;
wherein the alkanolamines are contained in the silica-based film forming material; and
wherein a cross-linking reaction of the siloxane polymer progresses immediately after coating, and the liquidity of the silica-based film forming material declines prior to filling the recessed parts.

* * * * *